United States Patent
Ikeda

(10) Patent No.: US 9,516,763 B2
(45) Date of Patent: Dec. 6, 2016

(54) CONDUCTIVE BALL MOUNTING METHOD

(71) Applicant: SHIBUYA KOGYO CO., LTD., Kanazawa-shi, Ishikawa-ken (JP)

(72) Inventor: Kazunari Ikeda, Kanazawa (JP)

(73) Assignee: SHIBUYA KOGYO CO., LTD., Kanazawa-shi, Ishikawa-ken (JP)

( * ) Notice: Subject to any disclaimer, the term of this patent is extended or adjusted under 35 U.S.C. 154(b) by 772 days.

(21) Appl. No.: 13/709,354

(22) Filed: Dec. 10, 2012

(65) Prior Publication Data
US 2013/0098975 A1 Apr. 25, 2013

Related U.S. Application Data

(62) Division of application No. 12/138,006, filed on Jun. 12, 2008, now abandoned.

(51) Int. Cl.
*H05K 3/34* (2006.01)
*B23K 1/20* (2006.01)
*H01L 21/48* (2006.01)

(52) U.S. Cl.
CPC ............ *H05K 3/3478* (2013.01); *B23K 1/20* (2013.01); *H01L 21/4853* (2013.01); *H05K 2203/041* (2013.01); *H05K 2203/0557* (2013.01); *H05K 2203/082* (2013.01); *Y10T 29/49117* (2015.01); *Y10T 29/49144* (2015.01); *Y10T 29/49149* (2015.01); *Y10T 29/53191* (2015.01)

(58) Field of Classification Search
CPC ............... H05K 3/3478; H05K 2203/041; H05K 2203/0557; H05K 2203/082; H01L 21/4853; B23K 1/20; Y10T 29/49144; Y10T 29/49149; Y10T 29/53191; Y10T 29/49117
See application file for complete search history.

(56) References Cited

U.S. PATENT DOCUMENTS

| | | | |
|---|---|---|---|
| 5,174,021 A | 12/1992 | L'Esperance, III et al. | |
| 5,284,287 A | 2/1994 | Wilson et al. | |
| 5,290,081 A | 3/1994 | Ogura | |
| 5,657,528 A | 8/1997 | Sakemi et al. | |
| 6,176,008 B1 | 1/2001 | Ueoka | |
| 6,270,002 B1 | 8/2001 | Hayashi et al. | |
| 6,352,189 B1 | 3/2002 | Kobayashi | |
| 6,533,159 B1 * | 3/2003 | Cobbley et al. | H05K 3/3478 |
| 2005/0035182 A1 | 2/2005 | Mano et al. | |
| 2007/0251089 A1 | 11/2007 | Kawamura et al. | |

FOREIGN PATENT DOCUMENTS

| | | |
|---|---|---|
| CN | 1617295 A | 5/2005 |
| JP | 11-26630 | 1/1999 |
| JP | 2000-277899 A | 10/2000 |
| JP | 2000332046 A | 11/2000 |
| JP | 2003-273146 | 9/2003 |
| JP | 2004-165492 | 6/2004 |
| JP | 2006043882 A * | 2/2006 |
| JP | 2006-073999 | 3/2006 |
| JP | 2006-318994 | 11/2006 |

* cited by examiner

*Primary Examiner* — A. Dexter Tugbang
(74) *Attorney, Agent, or Firm* — Drinker Biddle & Reath LLP

(57) ABSTRACT

A conductive ball mounting method for mounting conductive balls on a mount using an arraying mask, in which the mount includes mounting portions formed in a predetermined pattern, and the arraying mask is provided above the mount and includes through holes provided in portions corresponding to the mounting portions. The method includes providing a ball suction unit for sucking solder balls, the ball suction unit including a ball holding member capable of holding the conductive balls, sucking up the conductive balls below the ball suction unit, holding the conductive balls on a lower surface of the ball holding member while sucking up the conductive balls, and after the holding the conductive balls, falling the conductive balls held by the ball holding member to the mount.

3 Claims, 5 Drawing Sheets

CONDUCTIVE BALL MOUNTING METHOD

This is a divisional application of copending prior application Ser. No. 12/138,006, filed on Jun. 12, 2008, which is incorporated by reference herein in its entirety.

BACKGROUND OF THE INVENTION

1. Field of the Invention

The present invention relates to a method and apparatus for mounting conductive balls in mounting locations on amount which are formed in a predetermined pattern using an arraying mask in which through holes are provided in such a manner as to match the mounting locations.

2. Description of the Related Art

As a method and apparatus for mounting conductive balls in mounting locations on a mount which are formed in a predetermined pattern using an arraying mask in which through holes are provided in such a manner as to match the mounting locations, JP-A-2006-318994 discloses a method and apparatus for arraying conductive balls on amount by a ball reservoir accommodating therein a large number of conductive balls moving over an arraying jig.

In the mounting approach adopted in the method and apparatus for mounting conductive balls disclosed in JP-A-2006-318994 in which conductive balls are dropped to be mounted by the moving ball cup, conductive balls are caught between the ball cup and the arraying mask. In addition, as the diameters of conductive balls used get smaller, higher accuracies are required for the gap between the ball cup and the arraying mask, flatness of the arraying mask and horizontal travel of the ball cup, and with these accuracies getting lower, there has been caused a risk that conductive balls leak from the gap between the ball cup and the arraying mask.

In order to prevent the occurrence of conductive balls being caught in the way described above, JP-A-2006-73999 discloses an apparatus and method in which a collection of balls within a ball cup (a tubular member in JP-A-2006-73999) are prevented from being brought into contact with a wall of the ball cup by a gas flow while the ball cup is moving horizontally.

However, since the ball cup had to be moved in such a manner that the collection conductive balls were not brought into contact therewith, the moving speed of the ball cup could not be increased to high speeds, this having led to a problem that a long period of time was necessary for the mounting process. In addition, although it was considered that the flow speed of gas flowing in from the gap between the arraying mask and the ball cup was increased to high speeds, with the gas flow speed so increased, conductive balls were not able to be collected on the arraying mask but were caused to scatter in the gas within the ball cup, and there sometimes occurred a situation in which no conductive balls were mounted in some of the mounting locations.

SUMMARY OF THE INVENTION

An object of the invention is to prevent conductive balls from being caught between the ball cup or ball suction body and the arraying mask when the ball cup or ball suction body is moving by causing conductive balls being sucked to the ball suction body which lies above the arraying mask when conductive balls are caused to fall into the through holes in the arraying mask to be mounted on the mount. This allows for an increase in moving speed of the ball cup which supplies conductive balls, so as to contribute to an increase in productivity.

With a view to solving the problem, the following means are adopted in a conductive ball mounting method and apparatus for mounting conductive balls in mounting locations on amount which are formed in a predetermined pattern using an arraying mask in which through holes are provided in such a manner as to match the mounting locations.

As a first means, there is provided a ball suction body provided above the arraying mask and connected to a vacuum source to suck conductive balls to a lower surface thereof.

As a second means, there is provided a vacuum switching means for switching the suction state of the ball suction body which is formed by the vacuum source between ON and OFF.

As a third means, a configuration is adopted in which the suction state of the ball suction body is switched to ON by the vacuum switching means so that conductive balls residing below the ball suction body are sucked to the ball suction body, and thereafter, the suction state of the ball suction body is switched to OFF so as to allow the conductive balls held sucked to the ball suction body to fall so that the conductive balls so falling are mounted on the mount.

For example, following aspects can be raised.

According to a first aspect of the invention, there is provided a conductive ball mounting method for mounting conductive balls on a mount using an arraying mask, the mount including mounting portions formed in a predetermined pattern, the arraying mask provided above the mount and including through holes provided in portions corresponding to the mounting portions, the method including: providing a ball suction unit for sucking solder balls, the ball suction unit including a ball holding member capable of holding the conductive balls; sucking up the conductive balls below the ball suction unit; holding the conductive balls on a lower surface of the ball holding member while sucking up the conductive balls; and after the holding the conductive balls, falling the conductive balls held by the ball holding member to the mount.

According to a second aspect of the invention, the ball suction unit is connected to switching means for switching ON and OFF sucking the conductive balls by the ball suction unit, the sucking up the conductive balls and holding the conductive balls are executed when the switching means is switched ON, and the falling the conductive balls is executed when the switching means is switched OFF.

According to a third aspect of the invention, the conductive ball mounting method further includes forming a gas flow passage between the ball suction unit and the arraying mask by switching ON the switching means so as to suck the conductive balls by the ball suction unit, wherein the sucking up the conductive balls and holding the conductive balls are executed by causing gas to be drawn in from the gas flow passage.

According to a fourth aspect of the invention, the conductive ball mounting method further includes repeating the sucking up the conductive balls through the falling the conductive balls a plurality of times.

According to a fifth aspect of the invention, the conductive ball mounting method further includes, after the conductive balls are mounted on the mount by the falling the conductive balls, collecting the conductive balls remained on the arraying mask by executing the sucking up and holding the conductive balls.

According to a sixth aspect of the invention, there is provided a conductive ball mounting apparatus including: a mount including mounting portions formed in a predetermined pattern; an arraying mask provided above the mount and including through holes provided in portions corresponding to the mounting portions; a ball suction unit provided above the arraying mask for sucking solder balls; a ball holding member included in the ball suction unit and capable of holding the conductive balls on a lower surface thereof; vacuum source connected to the ball suction unit for allowing the ball suction unit to suck the conductive balls; and switching means for switching ON and OFF sucking the conductive balls by the ball suction unit, wherein the switching means is configured to: switch ON the sucking the conductive balls so as to suck up the conductive balls below the ball suction unit and hold the conductive balls on a lower surface of the ball holding member; and switch OFF the sucking the conductive balls so as to allow the conductive balls held by the ball holding member to fall to the mount.

According to a seventh aspect of the invention, the ball suction unit further includes a casing, and the ball holding member is provided on a lower surface of the casing.

According to an eighth aspect of the invention, the ball suction unit further includes a ball cup including an interior space and an opening on a lower end face thereof.

According to a ninth aspect of the invention, the ball cup is made of a conductive material and is grounded.

According to a tenth aspect of the invention, the switching means is configured to repeat ON/OFF the sucking the conductive balls a plurality of times.

According to an eleventh aspect of the invention, the ball suction unit is configured to move along an upper surface of the arraying mask while the sucking the conductive balls is switched to ON.

According to a twelfth aspect of the invention, the conductive ball mounting apparatus further includes vibration means for vibrating the ball suction unit.

According to a thirteenth aspect of the invention, the ball holding member includes a mesh that is configured to allow passage of the gas but not to allow passage of the conductive balls.

According to a fourteenth aspect of the invention, wherein the ball holding member partitions an interior space of the ball suction unit into an upper space and a lower space.

According to a fifteenth aspect of the invention, the conductive ball mounting apparatus further includes a ball supplying path connected to the lower space of the ball suction unit for supplying the conductive balls.

According to a sixteenth aspect of the invention, the conductive ball mounting apparatus further includes a suction passage connecting the upper space of the ball suction unit and the vacuum source.

Since the invention is configured such that the suction state of the ball suction body is switched to ON by the vacuum switching means so that conductive balls residing below the ball suction body are sucked to the ball suction body, and thereafter, the suction state of the ball suction body is switched to OFF so as to allow the conductive balls held sucked to the ball suction body to fall so that the conductive balls so falling are mounted on the mount, it has become possible to prevent conductive balls from being caught between the ball suction body and the ball cup attached thereto and the arraying mask. As a result of this, the moving speed of the ball suction body and the ball cup can be increased, so as to realize an increase in productivity.

DETAILED DESCRIPTION OF THE PREFERRED EMBODIMENTS

Hereinafter, a mode for carrying out the invention will be described together with an embodiment according to the drawings. In this invention, as a mount for conductive balls, there are raised a semiconductor wafer (hereinafter, referred simply to a wafer), an electronic circuit board, a ceramic substrate and the like, and electrodes are formed as conductive ball mounting locations thereof. In an embodiment, a solder balls mounter is used in which conductive balls are solder balls 1 and a mount is a wafer 2.

Although a solder balls mounter has in general a wafer receiving section where wafers are delivered in, a flux printing section, a ball mounting section, and a wafer discharging section where wafers are delivered out, a conductive ball mounting method and apparatus according to the invention relates to the ball mounting section.

Figure 1:
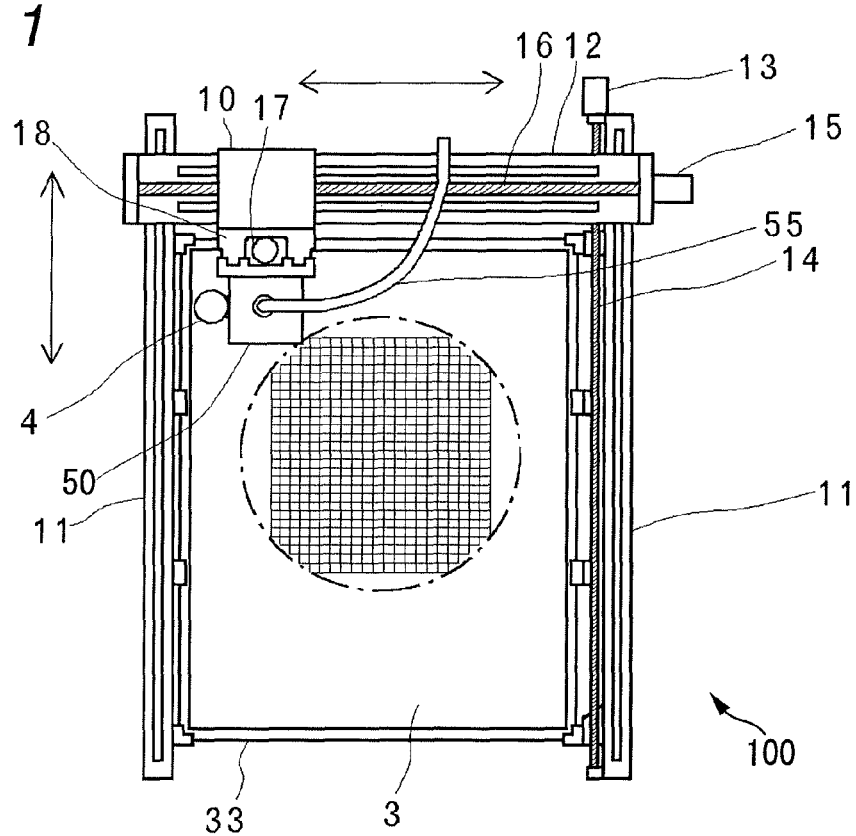
FIG. 1 is an explanatory plan view showing the whole of a ball mounting section according to the invention.

FIG. 1 shows a ball mounting section 100 of the invention. In the ball mounting section 100, there are provided a solder ball supply unit 4, a ball arraying mask 3 in which through holes 31 are formed in such a manner as to be arrayed to match an electrode patterns on a wafer 2, a ball reservoir 50 for dropping solder balls 1 into the through holes 31 and a drive mechanism for the ball reservoir 50. The ball reservoir function as an example of a ball suction unit.

In the embodiment, the thickness of the ball arraying mask 3 is almost the same as the diameter of solder balls 1 to be supplied, and the diameter of the through holes 31 is made slightly larger than the diameter of the solder ball. However, in the through hole 31, the diameter of a lower opening is made larger than the diameter of an upper opening so that a flux printed on a wafer 2 is prevented from sticking to the ball arraying mask 3. In place of increasing the opening diameter in this way, a flux sticking preventive gap may be provided between the ball arraying mask 3 and the wafer 2. In addition, the ball arraying mask 3 is expanded over a frame 33 and is held to a fixing portion such a frame structure.

(First Embodiment)

Figure 2:
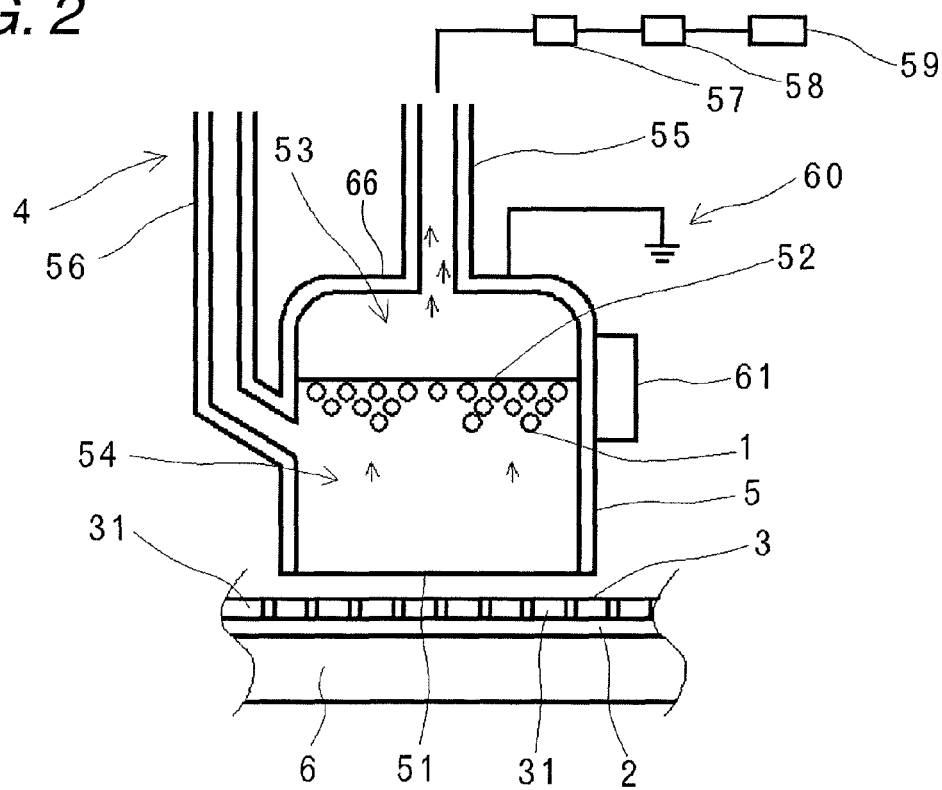
FIG. 2 is an explanatory view of a ball cup in such a state that conductive balls are sucked thereto in a first embodiment of the invention.

A first embodiment of the invention will explained with reference to FIG. 2. As shown in FIG. 2, the ball cup 5 has interior space and is opened in a lower end face so as to define an opening 51, and the interior space is partitioned into an upper space 53 and a lower space 54 by a ball suction element 52 as an example of a ball holding member. Thus, an upper portion of the ball cup 5 which lies further upwards than the ball suction element 52 constitutes a casing 66 for the ball suction element 52. In other words, the ball suction element 52 is provided on a lower surface of the casing 66. In the first embodiment, the ball reservoir 50 as the ball suction unit is configured by the ball cup 5, the ball suction element 52 and the casing 66. The ball suction element 52 is made of a metallic net such as a stainless mesh which does not allow for the passage of the solder balls 1 but allows for the passage of gas. In addition, in the embodiment illustrated, although the ball cup 5 is made up of a single rectangular parallelepiped, the number, shape and size thereof are determined in consideration of the shape of a wafer 2 used and ball mounting efficiency. For example, the lower end opening 51 may be formed into a circular shape or a plurality of ball cups each including a ball suction element 52 may be provided.

The upper space 53 of the ball cup 5 is connected to a vacuum source 59 by way of a suction passage 55 via an electromagnetic or solenoid opening and closing valve 57 functioning as a switching means (vacuum switching means) and a regulator 58 which can regulate the pressure and flow rate of gas and defines a gas flow passage between the ball arraying mask 3 and itself as is shown in arrows in FIG. 2. Then, by opening the solenoid opening and closing valve 57 as the switching means for switching the suction state within the ball cup 5 to ON and OFF, the suction state within the ball cup 5 is switched to ON so as to suck solder balls 1 residing below the ball cup 5 to the ball suction element 52, and thereafter, by closing the solenoid opening and closing valve 57, the suction state within the ball cup 5 is switched to OFF so as to cause the solder balls 1 held sucked to the ball suction element 52 to drop so that the solder balls 1 are mounted on the wafer 2. In other words, the solenoid opening and closing valve 57 is capable of switching ON and OFF sucking the solder balls 1, and is configured to switch ON the sucking the solder balls 1 so as to suck up the solder balls 1 below the ball cup 5 and hold the solder balls 1 on a lower surface of the ball suction element 52 while sucking up the solder balls 1, and then, switch OFF the sucking the solder balls 1 so as to allow the solder balls 1 held by the ball suction element 52 to fall to the wafer 2 in order to mount the solder balls 2 on the wafer 2.

In addition, the ball cup 5 and the ball suction element 52 are made of a conductive material and are earthed by an earth 60 as is shown in FIGS. 2 to 5. By this configuration, the solder balls 1 charged with static electricity are prevented from sticking to an inner surface of the ball cup 5 and the ball suction element 52. Furthermore, a vibrator 61 is mounted on an exterior side of the ball cup 5 so that the vibrator 61 imparts minute vibrations to the ball cup 5, and the vibrator 61 is made to vibrate at least when the suction state within the call cup 5 is OFF so as to vibrate the ball suction element 52 attached to the ball cup 5 to promote the drop of the solder balls 1.

The solder balls supply unit 4 supplies solder balls 1 from a ball hopper which reserves a large number of solder balls 1 therein to the ball cup by way of a ball supply path 56. The ball supply path 56 is connected to the lower space 54 of the ball cup 5 for supplying the conductive balls below the ball suction element 52. Note that ball hoppers are replaced depending upon sizes and materials of solder balls 1.

The ball cup 5 moves in an X-axis direction and a Y-axis direction so as to cover the whole surface of the wafer 2. A moving unit 10, which constitutes a moving means of the ball cup 5 on a horizontal plane includes, as is shown in FIG. 1, an X-axis drive mechanism and a Y-axis drive mechanism, so that the moving unit 10 moves in the X-axis direction along an X-axis guide 11 by means of a ball screw 14 which is rotated by an X-axis drive motor 13 and moves in the Y-axis direction along a Y-axis guide 12 by means of a ball screw 16 which is rotated by a Y-axis drive motor 15.

A lift unit 18 of the ball cup 5 is such as to move the ball cup 5 vertically through a configuration in which a lift base to which the ball cup 5 is attached is attached via a nut member to a ball screw which is rotated by a Z-axis drive motor 17 equipped on the moving unit 10 and the lift base moves vertically along a guide rail. Note that a gap between a lower end of the ball cup 5 and an upper surface of the ball arraying mask 3 may be larger than the diameter of the solder ball 1, provided that the gap is such as to obtain a predetermined gas flow when a ball sucking operation is performed. In addition, although the solder balls supply unit 4 is made to move together with the ball cup 5 so as to supply solder balls 1 into the ball cup 5, the solder balls supply unit 4 may be provided separately from the ball cup 5. Furthermore, solder balls 1 are temporarily supplied onto the ball arraying mask 3 which lies outside the ball cup 5, and then by moving the ball cup 5 while sucking the solder balls 1 on the ball arraying mask 3 by the ball suction element 52, the solder balls 1 can be supplied to the mounting positions.

Hereinafter, the operation of the first embodiment will be described. Firstly, prior to the transfer of a wafer 2 to the ball mounting section, a flux is applied in advance to ball mounting locations on the wafer 2 in the flux printing section.

Figure 3:
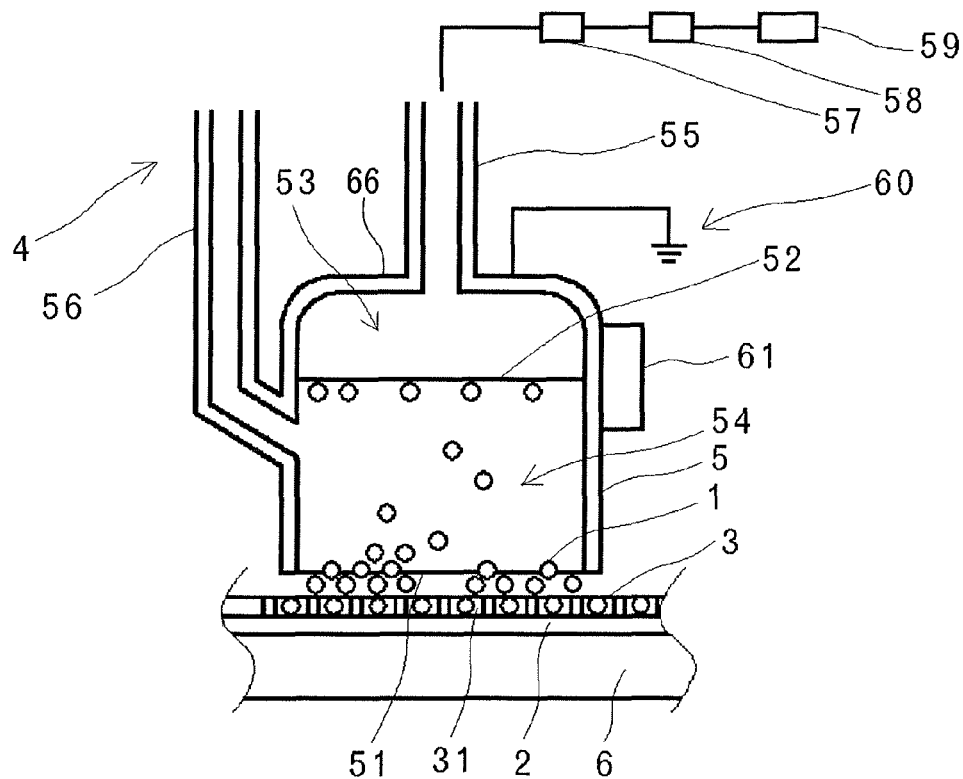
FIG. 3 is an explanatory view of the ball cup in such a state that the conductive balls are dropping in the first embodiment.

When the wafer 2 is transferred to the ball mounting section, as is shown in FIGS. 2 and 3, the wafer 2 is installed on a wafer installation stage 6, and the ball arraying mask 3 is disposed on the wafer 2. Note that in this embodiment, since the flux is prevented from sticking to the ball arraying mask 3 by the shape of the through holes 31 in the ball arraying mask 3, although the ball arraying mask 3 and the wafer 2 are in contact with each other, in the event that the flux sticking prevention is attempted to be implemented by the gap vertically defined between the ball arraying mask 3 and the wafer 2, these two members are not in contact with each other.

Next, after the suction state within the ball cup 5 is switched to ON by opening the solenoid opening and closing valve 57 as the switching means, the ball cup 5 is moved to an initial mounting position by the moving unit 10. By switching the suction state within the ball cup 5 to ON (in other words, by repeating ON/OFF the sucking the solder balls 1 a plurality of times), the gas flow passage indicated by the arrows in FIG. 2 is formed between the ball cup 5 and the ball arraying mask 3. Solder balls 1 residing below the ball cup 5 are caused to float to be sucked to the ball suction element 52 by virtue of vacuum through the gas flow passage. This state constitutes a movable state of the ball cup 5. With the suction state being OFF, the ball cup 5 is not moved.

After the ball cup 5 has moved to the initial mounting position, the solenoid opening and closing valve 57 is closed so that the suction state within the ball cup 5 is switched to OFF and the vibrator 61 is started to vibrate. Since the ball cup 5 is released to the atmosphere when the vacuum is stopped, the solder balls 1 held sucked to the ball suction element 52 as is shown in FIG. 3 are allowed to drop into the through holes 31 in the ball arraying mask 3 so as to be mounted on the wafer 2. To ensure the drop of the solder balls 1 into the through holes 31, that is, the mounting thereof on the wafer 2, the suction state is switched to ON (vacuum started) and OFF (vacuum stopped) a plurality of times, and the vibrator 61 is made to repeat the stop and start of vibrations in association with the opening and closing of the solenoid opening and closing valve 57.

In addition, since the ball suction element 52 is disposed above the ball arraying mask 3, the solder balls 1 held sucked to the ball suction element 52 have potential energy, whereby the solder balls 1 are allowed to be brought into tight contact with electrodes when they drop on the flux.

After the mounting has been completed, the suction state within the ball cup 5 is switched to ON by the switching means, and vacuum is implemented again. The solder balls 1 mounted on the wafer 2 are prevented from being sucked up due to adhesion generated through the contact of the solder balls 1 with the flux, while the solder balls 1 which are not in contact with the flux are sucked up and float to thereby be sucked to the ball suction element 52. The ball cup 5 is moved to the next mounting position in this state. Note that moving to the following mounting position may be started as soon as the suction state of the ball cup 5 is switched to ON.

When a mounting operation at the final mounting position is completed, the solder balls 1 which leak out of the ball cup 5 to scatter over the ball arraying mask 3 are recovered. Specifically, the ball cup 5 which is under vacuum is moved along the upper surface of the ball arraying mask 3. Although this facilitates the recovery of solder balls 1, an exclusive vacuum recovery means may be provided.

In addition, although in the first embodiment, the ball cup 5 is released to the atmosphere by the suction state of the ball suction element 52 being switched to OFF and the solder balls 1 held sucked thereto are allowed to drop by being vibrated by the vibrator 61, the solder balls 1 may be forced to drop by virtue of pressurization through the suction passage 55 after the suction state has been switched to OFF.

(Second Embodiment)

Figure 4:
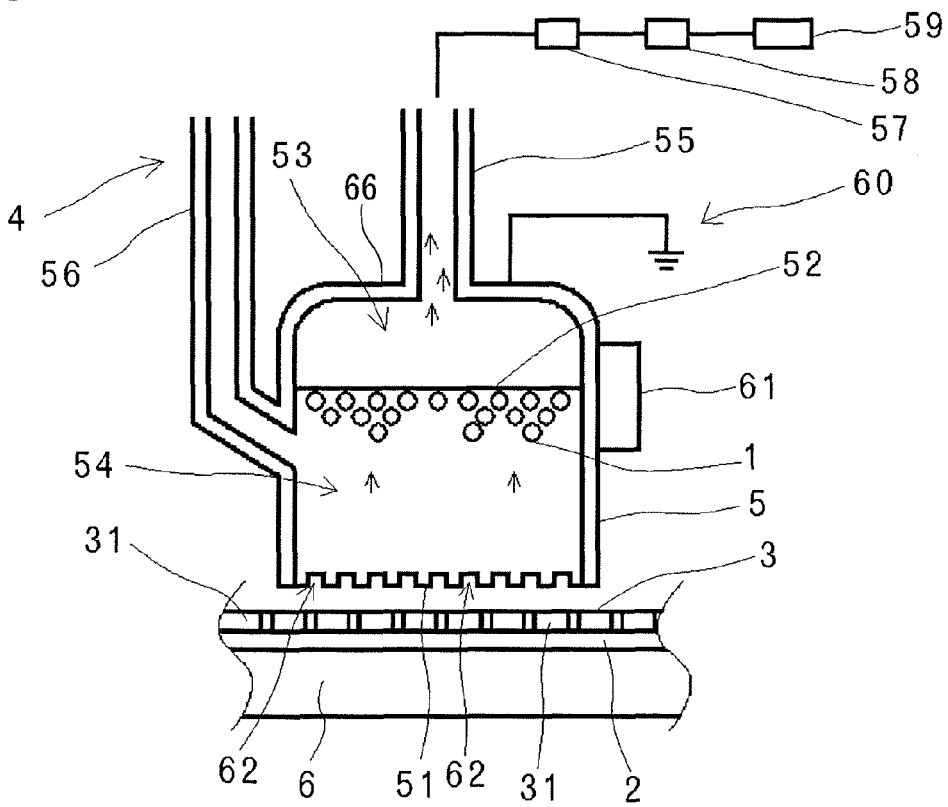
FIG. 4 is an explanatory view showing a ball cup of a second embodiment of the invention.

FIG. 4 shows a second embodiment of the invention. While in the first embodiment, the lower end face of the opening 51 of the ball cup 5 is formed into a planar shape which is in parallel with the ball arraying mask 3 and the ball cup 5 is disposed in such a position that the gap is formed the lower end face of the ball cup 5 and the upper surface of the ball arraying surface 3 in such a manner as to obtain the predetermined gas flow when the ball sucking operation is performed, in a second embodiment shown in FIG. 4, slits 62 are formed on a lower end face of an opening 51 of a ball cup 5 so that gas flows can be obtained. The slits 62 are preferably formed to be radiated in the opening 51 or preferably formed into spiral curves having directivity in one direction. By forming the slits 62 in this way, the flow of gas between the ball cup 5 and a ball arraying mask 3 can be controlled, thereby making it possible to prevent the floating of the ball arraying mask 3. Of course, depending upon the size of the slits 62 provided, the opening 51 of the ball cup 5 can be brought into contact with the ball arraying mask 3.

(Third Embodiment)

Figure 5:
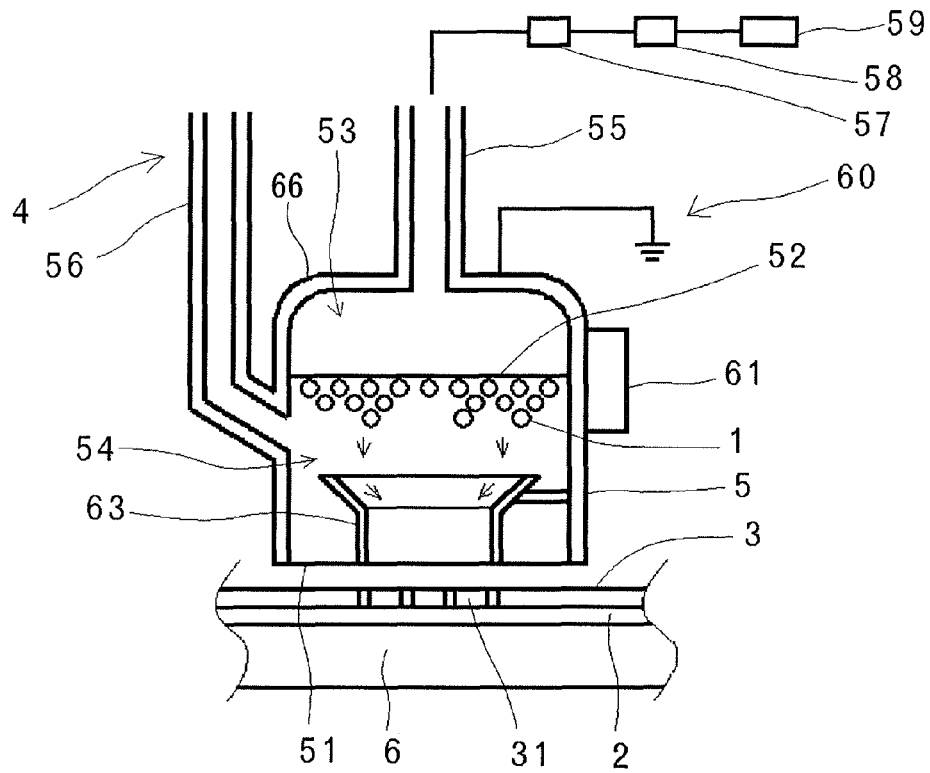
FIG. 5 is an explanatory view showing a ball cup of a third embodiment of the invention.

FIG. 5 shows a third embodiment of the invention. According to the third embodiment, in order to limit the range where the solder balls 1 drop from the ball suction element 52 down to the ball arraying mask 3, a ball guide 63, which is opened widely in an upper portion and is opened narrowly in a lower portion to match a mounting range, is provided below a ball suction element 52 of a ball cup 5.

(Fourth Embodiment)

Figure 6:
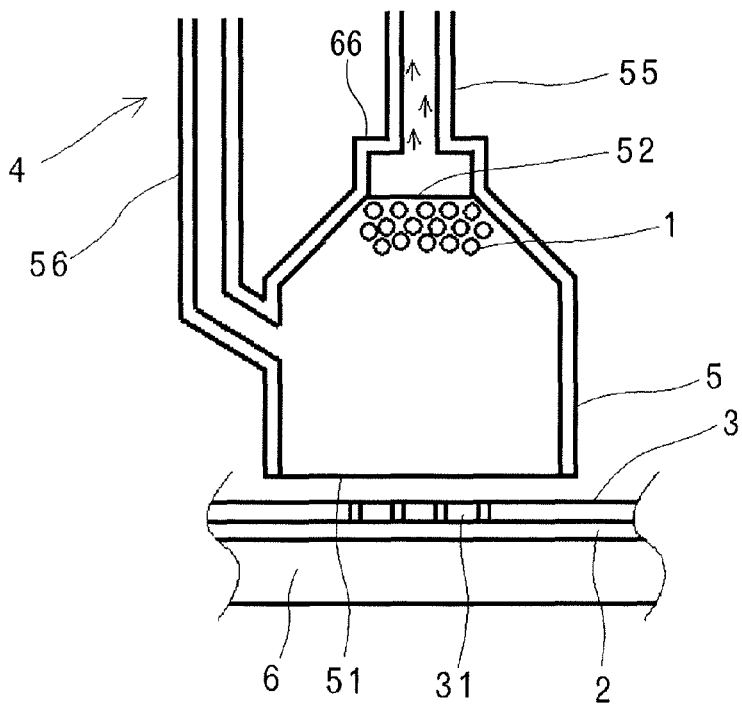
FIG. 6 is an explanatory view showing a ball cup of a fourth embodiment of the invention.

FIG. 6 shows a fourth embodiment of the invention. According to a fourth embodiment, an interior shape of a ball cup 5 is modified in such a manner that a ball suction element 52 is made small in size so as to match a mounting range.

(Fifth Embodiment)

Figure 7:
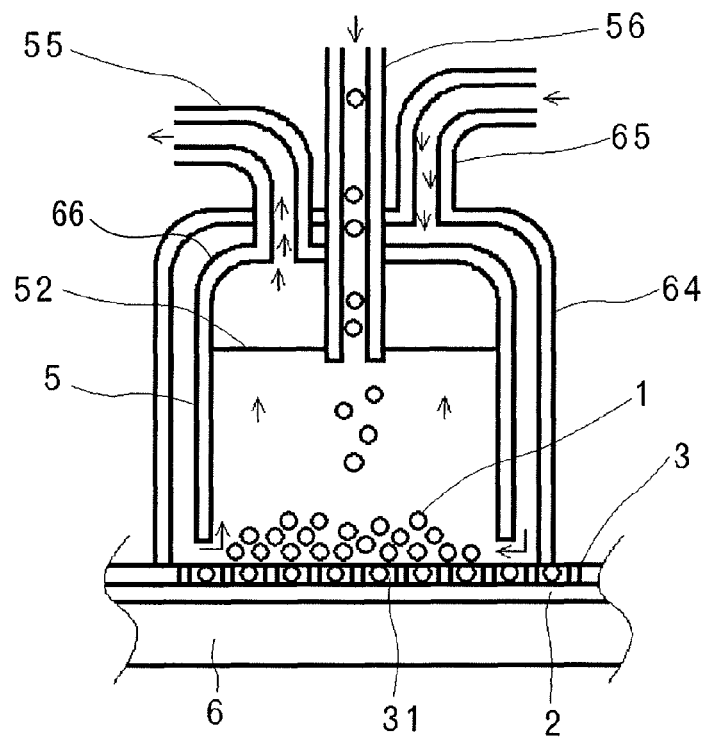
FIG. 7 is an explanatory view showing a relationship between a ball cup and a gas supply cup of a fifth embodiment of the invention.

FIG. 7 shows a fifth embodiment of the invention. According to the fifth embodiment, a gas supply cup 64 which covers a ball cup 5 is provided in such a manner as to be connected to a gas supply path 65, so as to supply gas such as air or nitrogen through the gas supply path 65. For example, in case nitrogen is supplied, a solder ball oxidization preventive effect can be obtained. In addition, the supply of gas from the gas supply path 65 is switched to ON when the suction state of a ball suction element 52 is switched to ON, while it is switched to OFF when the suction state of the ball suction element 52 is switched to OFF. Note that in FIG. 7, a pipe which passes through central portions of the ball cup 5 and the gas supply cup 64 is a ball supply path 56 of solder balls 1.

(Sixth Embodiment)

Figure 8:
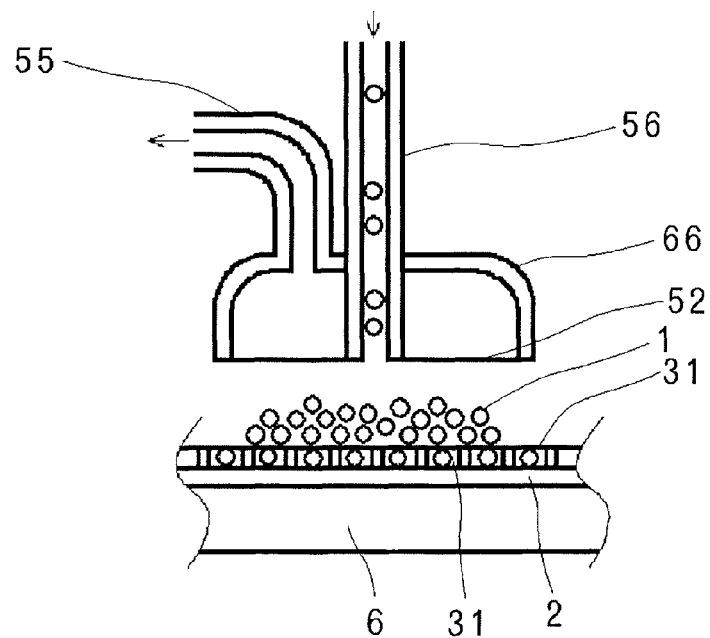
FIG. 8 is an explanatory view of a ball suction element of a sixth embodiment of the invention.

FIG. 8 shows a sixth embodiment of the invention. In addition, while in the first to fifth embodiments, the ball cup 5 is provided, as is shown in FIG. 8, the lower or downward portion of the ball cup 5 which lies further downwards than the ball suction element 52 may be eliminated. Namely, in place of the ball cup 5, a ball suction element 52 is provided at a lower end of a casing 66, and a suction passage 55 is connected to the casing 66, whereby solder balls 1 can be sucked by the ball suction element 52. In a sixth embodiment shown in FIG. 8, a ball reservoir 50 as the ball suction unit is configured by a casing 66 and a ball suction element 52, a ball supply path 56 is connected thereto through the ball suction element 52, and solder balls 1 are supplied on to a ball arraying mask 3 which lies below the ball suction element 52. In the sixth embodiment in which no ball cup 5 is provided, the position of the ball suction element 52 is set to be closer to the ball arraying mask 7 than those of the other embodiments.

(Seventh Embodiment)

Figure 9:
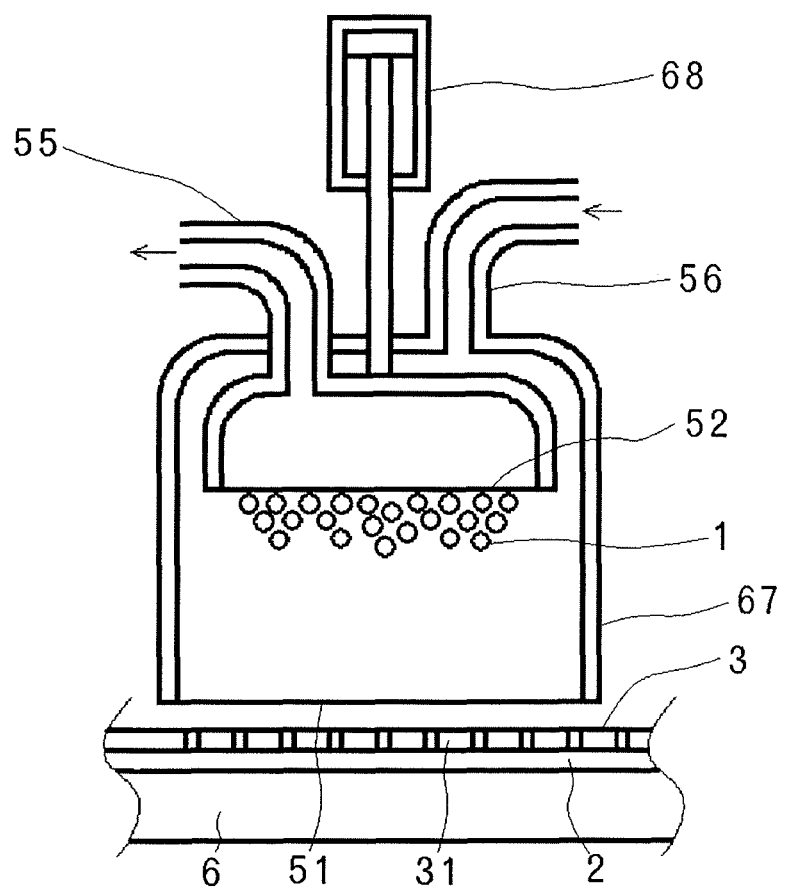
FIG. 9 is an explanatory view of a ball suction element with a ball supply cup of a seventh embodiment of the invention.

FIG. 9 shows a seventh embodiment of the invention. In the seventh embodiment, the lower or downward portion of the ball cup 5 which lies further downwards than the ball suction element 52 may be eliminated like in a similar manner to the sixth embodiment. In the seventh embodiment, a ball supply cup 67 is provided which covers a ball suction element 52 and which is connected to a ball supply path 56. The ball supply cup 67 functions not only to supply solder balls 1 but also to prevent the scattering of solder balls 1. In FIG. 9, reference numeral 68 denotes a lift unit for moving the ball suction element 52 vertically, and in the seventh embodiment, an air cylinder is used. The ball suction element 52 is located in a lower position which is close to a ball arraying mask 3 when balls are sucked, whereas when the balls are allowed to drop, the ball suction element 52 is located in an upper position above the ball arraying mask 3 to impart potential energy to the solder balls 1.

What is claimed is:

1. A conductive ball mounting method for mounting conductive balls on a mount using an arraying mask, the mount comprising mounting portions formed in a predetermined pattern, the arraying mask provided above the mount and comprising through holes provided in portions corresponding to the mounting portions, the method comprising:

providing mask holding means configured to hold the arraying mask above the mount;

providing a ball cup including an interior space and an opening on a lower end face of the ball cup;

providing a ball holding member that is provided inside the ball cup and is provided above the arraying mask, wherein the ball holding member is connected to a vacuum source and is configured to suck the conductive balls on a lower surface of the ball holding member;

providing switching means configured to switch ON and OFF a suction state in which the conductive balls are sucked by the ball holding member and within the interior space of the ball cup by using the vacuum source;

providing moving means configured to move the ball cup along an upper surface of the arraying mask; and mounting the conductive balls to the mounting portions by repeating operations a plurality of times, the operations comprising:

sucking operation comprising switching ON the suction state by the ball holding member by switching the switching means to flow in a gas through a gas flow passage formed between the ball cup and the arraying mask so as to suck up the conductive balls below the ball holding member to the ball holding member;

moving operation comprising moving the ball cup to a predetermined mounting position; and mounting operation comprising falling of the conductive balls sucked by the ball holding member by switching OFF the sucking the conductive balls by the ball holding member at the predetermined mounting position so as to mount the conductive balls to the mount.

2. The conductive ball mounting method according to claim 1, wherein the mounting operation comprising switching ON and OFF the suction state by the ball holding member for a plurality of times.

3. The conductive ball mounting method according to claim 1, further comprising, after performing the mounting operation, performing the sucking operation at the predetermined mounting position to suck up the conductive balls, which are not mounted to the mounting portions by the mounting operation, to the ball holding member so as to collect the conductive balls.

* * * * *